(12) United States Patent
Gray

(10) Patent No.: US 9,126,398 B2
(45) Date of Patent: Sep. 8, 2015

(54) APPARATUS FOR PASTE MATERIAL PRINTING, AND PRINTING METHOD

(71) Applicant: Robert Gray, Budford, GA (US)

(72) Inventor: Robert Gray, Budford, GA (US)

(73) Assignee: ASM ASSEMBLY SYSTEMS SINGAPORE PTE LTD, Singapore (SG)

( * ) Notice: Subject to any disclaimer, the term of this patent is extended or adjusted under 35 U.S.C. 154(b) by 229 days.

(21) Appl. No.: 13/951,637

(22) Filed: Jul. 26, 2013

(65) Prior Publication Data

US 2015/0027328 A1    Jan. 29, 2015

(51) Int. Cl.

| | |
|---|---|
| *B41F 15/08* | (2006.01) |
| *B41F 15/26* | (2006.01) |
| *B41M 1/12* | (2006.01) |
| *H05K 3/12* | (2006.01) |
| *G06K 15/02* | (2006.01) |
| *H05K 1/02* | (2006.01) |
| *B41F 15/18* | (2006.01) |
| *B41F 15/16* | (2006.01) |

(52) U.S. Cl.
CPC ............... *B41F 15/18* (2013.01); *B41F 15/085* (2013.01); *B41F 15/16* (2013.01); *B41M 1/12* (2013.01); *H05K 3/1216* (2013.01); *H05K 3/1225* (2013.01); *B41P 2215/00* (2013.01); *B41P 2215/114* (2013.01)

(58) Field of Classification Search
CPC .......... B41F 15/08; B41F 15/14; B41F 15/16; B41F 15/40; B41F 15/42; B41F 15/44; B41F 15/46; B41F 15/085; B41F 15/0813; B41F 15/0845; B41F 15/423; B41M 1/12; B41P 2215/00; B41P 2215/114; B41P 2215/132; B41P 2215/134; H05K 3/1233; H05K 3/1216; H05K 3/1225
USPC .......................... 101/121, 122, 123, 126–129
See application file for complete search history.

(56) References Cited

U.S. PATENT DOCUMENTS

| | | | |
|---|---|---|---|
| 6,202,551 B1* | 3/2001 | Murakami | 101/123 |
| 6,207,220 B1* | 3/2001 | Doyle et al. | 427/98.4 |
| 8,720,331 B2* | 5/2014 | Abe et al. | 101/127 |
| 2011/0239883 A1* | 10/2011 | Vegelahn et al. | 101/474 |
| 2013/0025481 A1* | 1/2013 | Moncavage | 101/126 |
| 2013/0313773 A1* | 11/2013 | Komatsu et al. | 271/265.01 |

\* cited by examiner

*Primary Examiner* — Leslie J Evanisko
*Assistant Examiner* — Marissa Ferguson Samreth
(74) *Attorney, Agent, or Firm* — Ostrolenk Faber LLP

(57) ABSTRACT

A screen printer 100 for paste material printing is disclosed herein. In a described embodiment, the screen printer 100 comprises a printing chamber 104; and a plurality of support members in the form of lifting tables 114, 116 arranged adjacent to one another along a single conveying path for individually supporting a respective PCB 202, 240 in the printing chamber 104. The screen printer 100 further includes a stencil 120 having a plurality of print patterns 124, 126 with each print pattern 124, 126 arranged adjacent to another print pattern to correspond to the positions of the lifting tables 114, 116 with each print pattern 124, 126 corresponding to a desired paste pattern to be printed onto the PCBs. The screen printer 100 also includes a paste printer arranged to print paste material on the at least one substrate using at least one of the print patterns. A screen printing method is also disclosed.

25 Claims, 10 Drawing Sheets

APPARATUS FOR PASTE MATERIAL PRINTING, AND PRINTING METHOD

BACKGROUND AND FIELD

This invention relates to a screen printer, more particularly but not exclusively, for the printing of paste material. This invention also relates to a screen printing method.

In a conventional surface mount technology ("SMT") production line, there is usually one screen printer. However, two or more screen printers may be used to achieve a higher throughput, especially when printing high-volume consumer products such as printed circuit boards ("PCBs") for mobile phones, automotive components etc. Having more than one screen printer is useful in high mix environments where batch sizes are smaller and the number of line changeovers is higher since when one printer is being reconfigured, the other printer may continue in operation and this reduces line downtime. However, when there is a lull period, the value of the screen printing goes up as compared to the costs of the total line since the two printers are not utilized to their maximum capacity.

SUMMARY

In a first aspect of the invention, there is provided a screen printer comprising a printing chamber; a plurality of support members for supporting one or more substrates in the printing chamber, the plurality of support members being arranged adjacent to one another along a single conveying path for conveying the one or more substrates with each support member capable of individually supporting a respective substrate in a printing position; a stencil having a plurality of print patterns with each print pattern arranged adjacent to another print pattern to correspond to the positions of the support members with each print pattern corresponding to a desired paste pattern to be printed on at least one substrate supported by one of the support members at the printing position; and a paste printer arranged to print paste material on the at least one substrate using at least one of the print patterns.

The references to "paste material" that are used in this application to include solder paste, adhesive, and epoxy materials etc, depending on what is to be printed on the substrate.

The references to "screen printer" and "screen printing" that are used in this application include any sort of apparatus or processes for paste material printing.

An advantage of the described embodiment is that, with the number of support members arranged adjacent to one another along the axis of the single lane conveyor of the printer, this allows greater flexibility and options since the screen printer is now configured to perform sequential operations/printing. For example, the screen printer may be configured to process one substrate at a time by configuring the support members accordingly and this may be useful for line ramp-up or ramp-down when only one side of the substrate is ready for processing. The screen printer may also be configured to print different paste heights on the same substrate using the plurality of print patterns (in this case, the print patterns are the same but the stencil (or screen) foil is adjusted accordingly). Also, the screen printer may also be configured to print two substrates sequentially in the printing chamber by having the support member configured to support the two substrates positioned adjacent to each other. As can be appreciated, the screen printer may then be customized for different operations.

Preferably, the screen printer further comprises a processor configured to select one or more of the support members for supporting a respective substrate depending on the number of substrates to be received in the printing chamber at any one time. This provides greater flexibility for configuring the printer for different operations. In this configuration, the screen printer may be arranged to selectively apply the paste material to the one or more substrates using either one or more of the print patterns depending on appropriate selection by the processor.

The printing chamber may be arranged to receive a first substrate and a second substrate, and the number of support members includes a first support member and a second support member arranged to support the first and second substrates respectively. In other words, the screen printer is arranged to process two substrates at a time. The first support member and the stencil may be moveable relative to each other to adjust their relative distance for moving the first substrate between a transport position through which the first substrate is transported into and out of the printing chamber, a vision position for fiducial recognition of the first substrate, and the printing position.

The second support member and the stencil may also be moveable relative to each other to adjust their relative distance for moving the second substrate between the transport position through which the second substrate is transported into and out of the printing chamber, the vision position for fiducial recognition of the second substrate, and the printing position.

Preferably, the first and second support members may be arranged to be separately alignable with the stencil for registering a first print pattern and a second print pattern sequentially with respective desired paste patterns of the first and second substrates; and wherein the paste printer may be arranged to print paste material on the first and second support members sequentially.

It is possible that the paste printer includes a single print head, the single print head being arranged to move linearly along a first axis relative to the stencil between a first position for printing the paste material on the first substrate and a second position for printing the paste material on the second substrate. The single print head may include one squeegee blade or a set of multiple squeegee blades.

In the alternative, it is envisaged that the paste printer may include two print heads arranged to print the paste material on the first and second substrates respectively. In this case, each print head may include one or more squeegee blades.

The screen printer may comprise a number of substrate stoppers with each substrate stopper being arranged to stop respective substrates at predetermined positions when the two or more substrates are conveyed into the printing chamber. Preferably, the plurality of print patterns may include two print patterns and the number of support members may include two support members. It is envisaged that one print pattern may be different from the other print pattern, or the two print patterns may be the same.

Preferably, the stencil may have a variable thickness. In this way, varying depths of paste material may be deposited on the substrate.

In a second aspect of the invention, there is provided a screen printing method comprising the steps of providing a printing chamber; arranging a plurality of support members for supporting one or more substrates in the printing chamber, the plurality of support members being arranged adjacent to one another along a single conveying path for conveying the one or more substrates with each support member capable of individually supporting a substrate at a printing position; providing a stencil having a plurality of print patterns with each print pattern arranged adjacent to one another to correspond to the adjacent arrangement of the support members;

supporting at least one substrate with one of the support members in the printing position, the at least one substrate including a desired paste pattern; and printing paste material on the at least one substrate using at least one of the print patterns which corresponds to the desired paste pattern.

The method may further comprise selecting one or more of the support members for supporting a respective substrate depending on the number of substrates to be received in the printing chamber at any one time. Accordingly, the method may further comprise applying the paste material selectively to the one or more substrates using at least one of the print patterns depending on the selection.

The method may also further comprise receiving a first substrate and a second substrate in the printing chamber, and supporting the first and second substrates by a first support member and a second support member respectively. Preferably, the method may further comprise moving the first support member, the second support member and the stencil relative to each other to adjust their relative distances to move the first and second substrates from a transport position through which the first and second substrates are transported into and out of the printing chamber; to a vision recognition position for fiducial recognition of the first and second substrates and then to the printing position.

The method may further comprise, at the vision recognition position, aligning the stencil with the second support member to register a second print pattern with the second substrate; and in the printing position, printing the paste material onto the second substrate using the second print pattern. The printing method may further comprise adjusting relative distances between the first and second support members and the stencil away from each other to separate the first substrate and the printed second substrate from the support member; aligning the stencil with the first support member to register a first print pattern with the first substrate; moving the first support member to the printing position; and printing the paste material on the first substrate using the first print pattern. In this way, the above sequence of operation allows each substrate to have an individual alignment to the stencil without a need to duplicate the alignment mechanism for two print areas.

The method may further comprise changing the relative positions between the first and second support members and the stencil to move the first and second substrates to the transport position; and transporting the first and second substrates out of the printing chamber.

If the printer has a single print head, the method may include moving the single print head linearly along a first axis relative to the stencil between a first position for printing the paste material on the first substrate and a second position for printing the paste material on the second substrate. In the alternative, the printer may have two print heads for printing the paste material, and the method includes printing the paste material on the first and second substrates using the respective print heads.

The method may also include conveying two or more substrates into the printing chamber, and stopping each substrate at a predetermined position using a respective substrate stopper.

It should be appreciated that features relating to one aspect may also be applicable to the other aspects.

BRIEF DESCRIPTION OF THE DRAWINGS

An example of the invention will now be described with reference to the accompanying drawings, in which.

DETAILED DESCRIPTION OF PREFERRED EMBODIMENT

Figure 1:
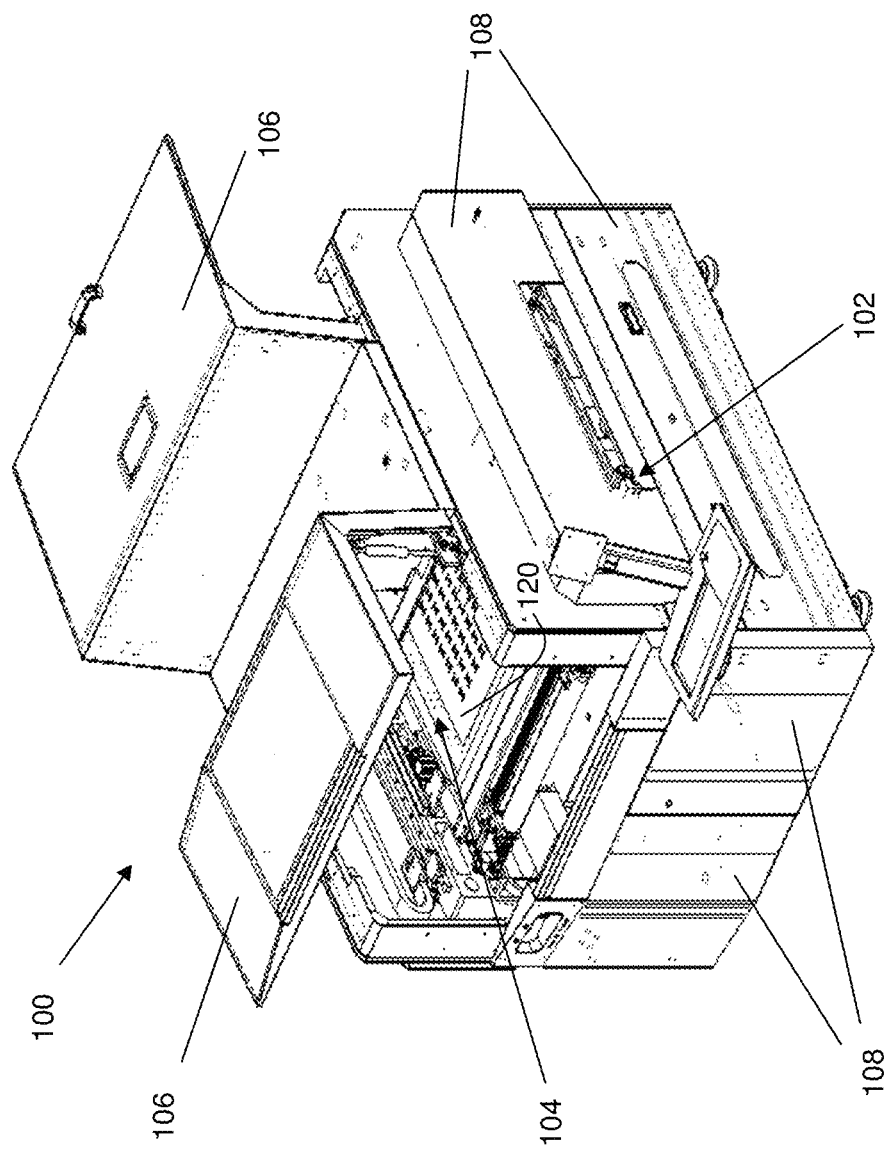
FIG. 1 is a perspective view of a screen printer with covers lifted according to a preferred embodiment of the invention to illustrate a stencil used for paste printing disposed in a printing chamber.

FIG. 1 is a perspective view of a screen printer 100 comprising a single lane conveyor system 102 for conveying substrates, such as printed circuit boards (PCBs) 200, in an end-to-end relationship into and across a printing chamber 104 of the screen printer 100. The screen printer 100 includes a pair of pivotable covers 106, shown in open positions in FIG. 1, to allow access to the printing chamber 104 and the pair of pivotable covers 106 is normally closed during operation of the screen printer 100. The screen printer 100 further includes a number of protective panels 108.

Figure 2:
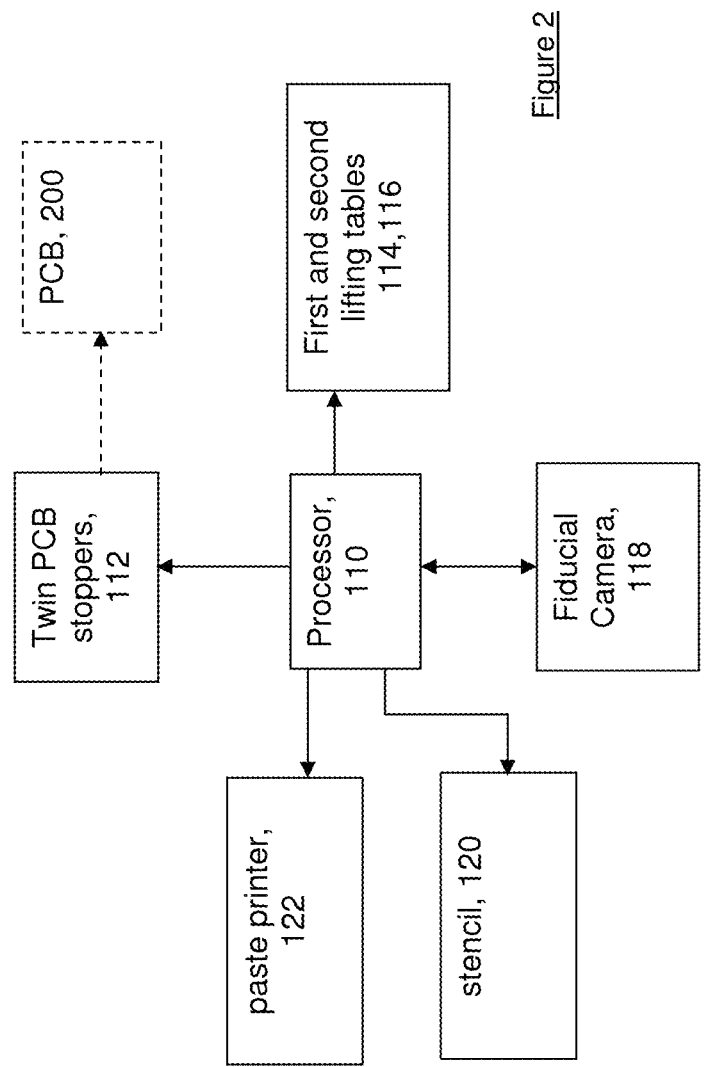
FIG. 2 is a control block diagram of the screen printer of FIG. 1.

FIG. 2 is a control block diagram of the screen printer 100 of FIG. 1 which includes a processor 110 for controlling twin PCB stoppers 112, movable support members in the form of first and second lifting blocks 114, 116, an image capturing device in the form of a fiducial camera 118, a stencil 120 and a paste printer 122 for printing paste material on the PCBs 200.

Figure 3:
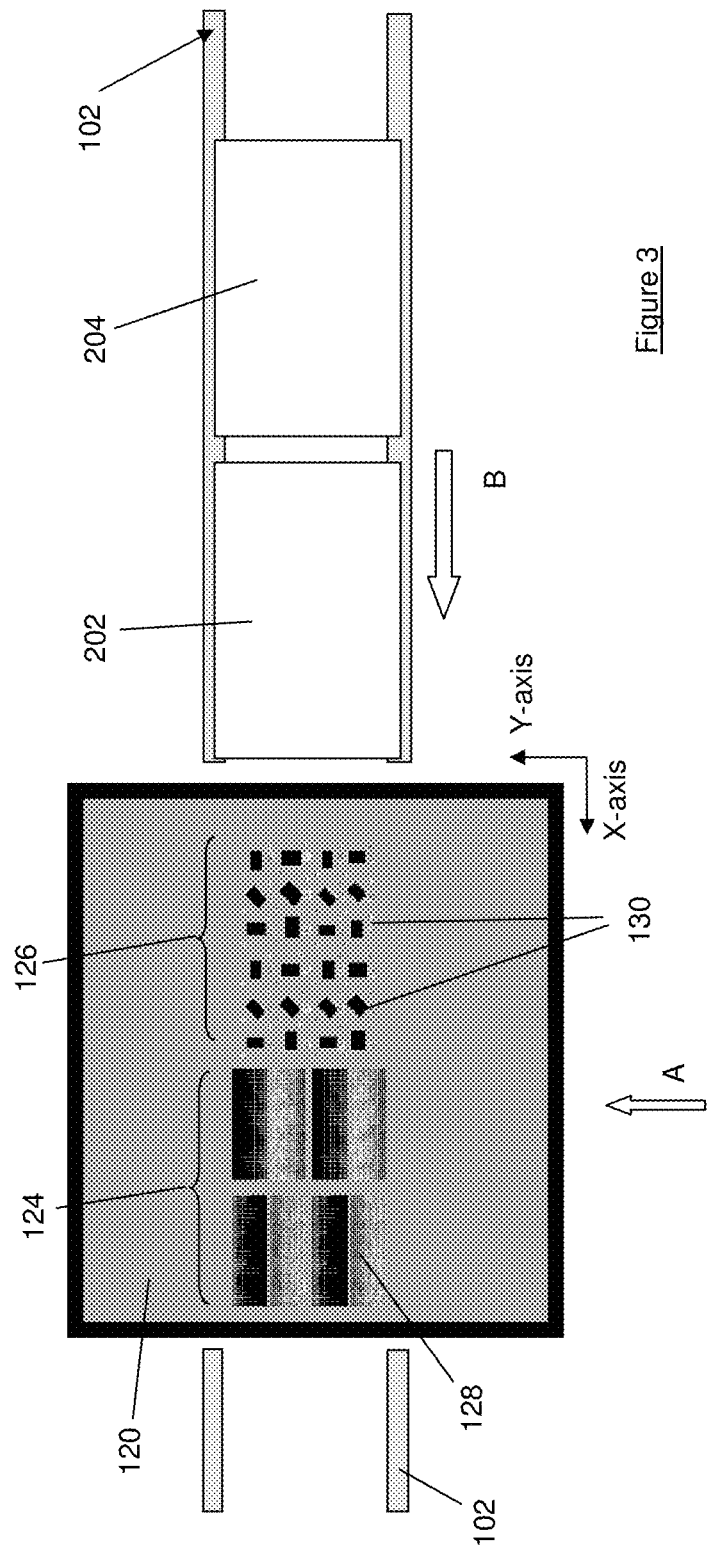
FIG. 3 is an enlarged top plan view of the stencil of FIG. 1 in the printing chamber (with other components of the printer being omitted) and illustrating a first PCB and a second PCB being transported into the printing chamber.

An operation of the control block diagram of the printer 100 will be described in relation to FIG. 2 and FIGS. 3 to 10 and the screen printer 100 is configured to process two PCBs 200 substantially simultaneously in this embodiment. FIG. 3 is an enlarged top plan view of the stencil 120 of FIGS. 1 and 2 (and omitting the other components of the screen printer 100 of FIG. 1), and first and second PCBs 202, 204 are being transported into the printing chamber 104 and underneath the stencil 120. FIGS. 4 to 9 are simplified end views of FIG. 3 in the direction A with the first and second PCBs 202, 204 transported beneath the stencil 120 and illustrating the various steps of performing paste printing of the first and second PCBs 202, 204. FIG. 10 is a top plan view of the first and second PCBs 202, 204 showing the PCBs 202, 204 after completing the paste printing of FIGS. 4 to 9.

In this embodiment, the conveyor system 102 is arranged to transport the PCBs 200 in end-to-end relationships and this includes loading the first and second PCBs 202, 204 together (i.e. in a pair) in a direction B into the printing chamber 104, as shown in FIG. 3. Prior to entering the printing chamber 104, the PCBs 202, 204 are processed in a usual manner which may include having their barcodes read for identification purposes. The stencil 120 is mounted in a usual manner in the printing chamber 104 but in this embodiment, the stencil 120 includes first and second print patterns 124, 126 arranged end-to-end along a X-axis of the stencil 120 with each print pattern 124, 126 having a number of apertures 128, 130 through which paste material is deposited onto respective solder pads of the first and second PCBs 202, 204. In other words, each print pattern 124, 126 is arranged to correspond to a respective pad layout (or desired paste pattern) of the PCBs 202, 204. In the illustrated embodiment, the first print pattern 124 corresponds to the pad layout of the first PCB 202 and the second print pattern 126 corresponds to the pad layout of the second PCB 204. With the first and second print patterns arranged end-to-end along the X-axis, this means that the first and second PCB's are loaded into the printing chamber 104 end-to-end also along the X-axis (i.e. substantially orthogonal to a Y-axis of the stencil 120)

Figure 4:
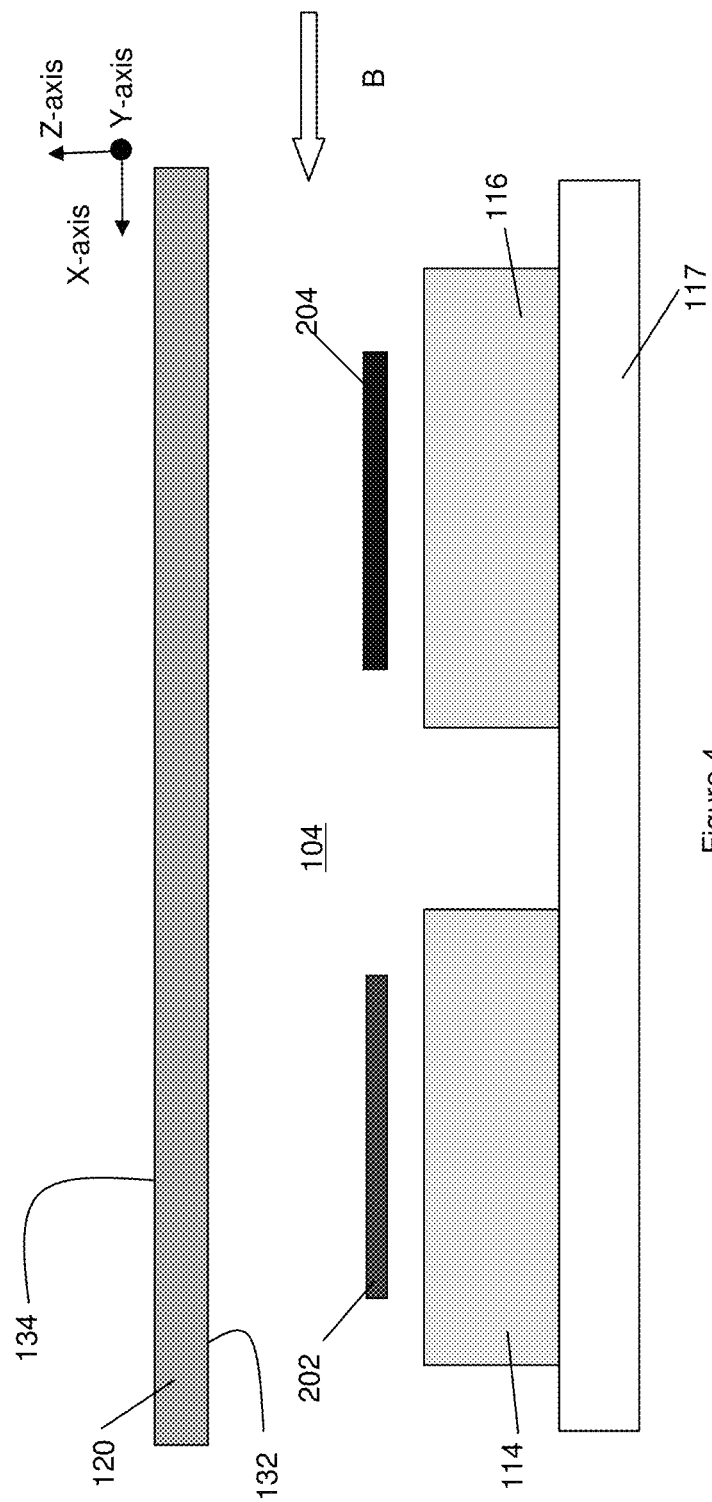
FIGS. 4 to 9 are simplified end views of FIG. 3 as seen from direction A as shown in FIG. 3 with the first and second PCBs in the printing chamber and below the stencil and illustrating various steps of performing paste printing of the first and second PCBs.
Figure 5:
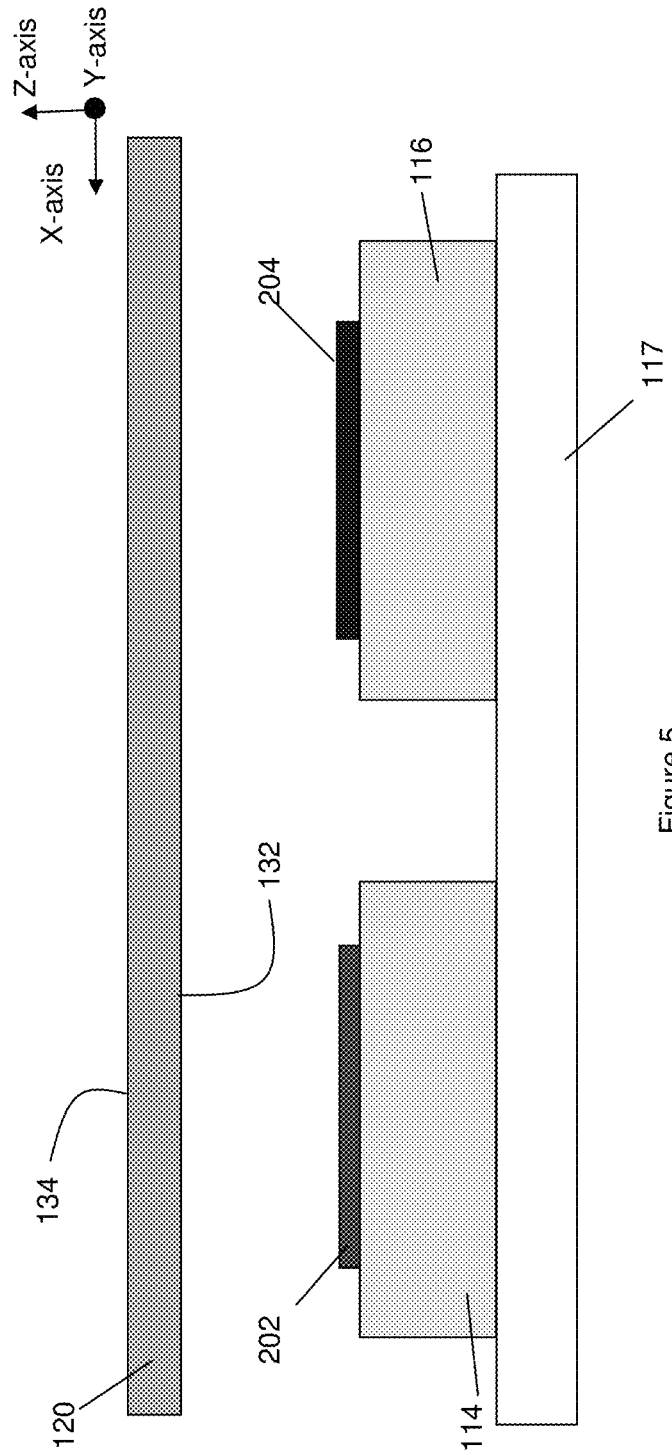

At designated image locations within the printing chamber 104, the processor 110 projects or extends the PCB stoppers 112, with each dedicated PCB stopper 112 stopping the respective first and second PCBs 202, 204 along the conveyor system 102 at a transport position (i.e. a position at a level through which the conveyor system 102 transports the PCBs 202, 204). The processor 110 next activates the first and second lifting blocks 114, 116 with each lifting block 114, 116 arranged adjacent to each other along a single conveying path (as defined by the single lane conveyor system 102) and below the respective first and second PCBs 202, 204 as shown in FIG. 4. Each lifting block 114, 116 is capable of individually supporting a respective PCB 202, 204. In this embodiment, the lifting blocks 114,116 are further supported by a lifting table 117. Next, the two PCB stoppers 112 are retracted, and the first and second lifting blocks 114, 116 are raised collectively by raising the lifting table 117 to enable the lifting blocks 114,116 to support the respective first and second PCBs 202, 204 and move the PCBs 202, 204 to a vision position (along the Z-axis), as shown in FIG. 5. In the vision position, the processor 110 activates the fiducial camera 118 to perform fiducial recognition firstly of a number of fiduciary markers on the first PCB 202 and the stencil 120 and, secondly, of fiduciary markers on the second PCB 204 and the stencil 120 to determine or measure the exact relative positions between the first and second PCBs 202, 204 and the stencil 120.

Based on the measured relative positions between the first and second PCBs 202 and the stencil 120, 204, the processor 110 calculates any adjustment which may be required to align the stencil 120 (specifically the first and second print patterns 124, 126) to the respective pad layouts of the first and second PCBs 202, 204. The processor 110 next adjusts the stencil 120 with its bottom side 132 to be aligned to one of the PCBs 202, 204 based on the calculated adjustment and in this case, the first alignment is to enable the second print pattern 126 of the stencil 120 to be registered with the pad layout of the second PCB 204.

Figure 6:
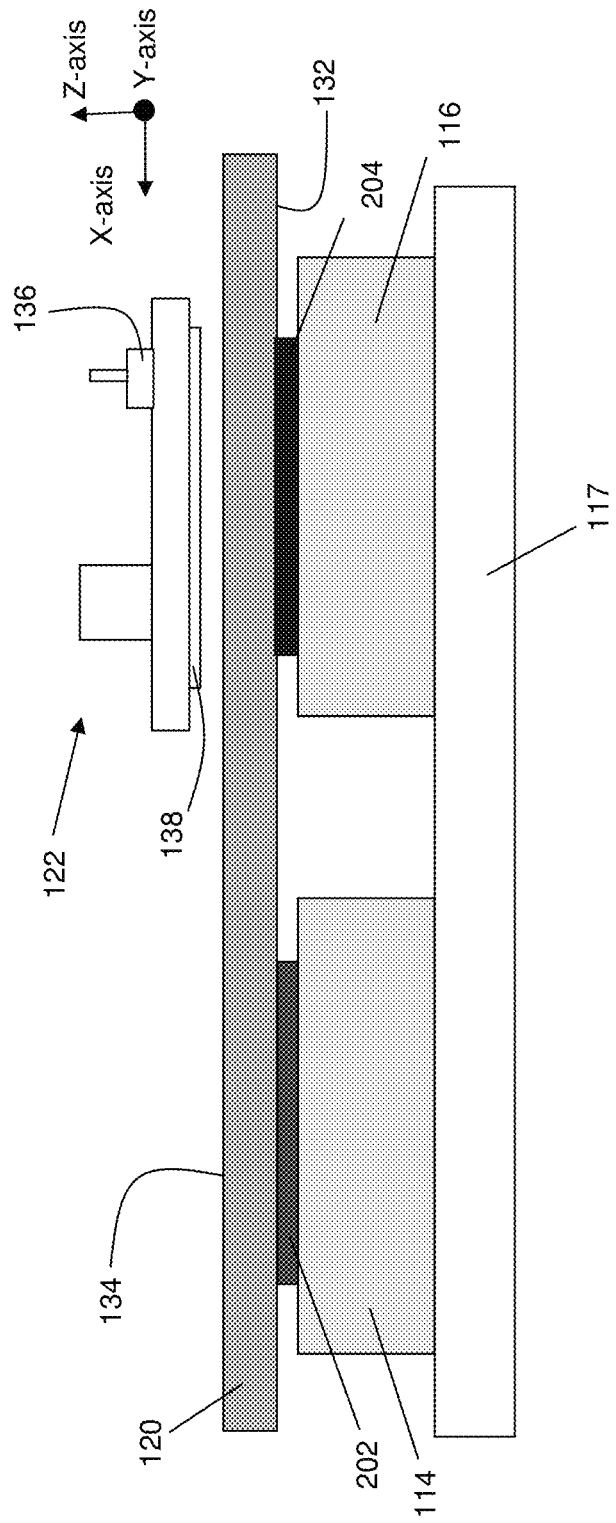

As shown in FIG. 6, the lifting table 117 raises both the first and second lifting blocks 114, 116 in the Z-axis to raise or lift the respective first and second PCBs 202, 204 to a stencil height or printing positions and with the stencil 120 aligned to the second PCB 204, the processor 110 activates the paste printer 122 to move to the second print pattern 126. In this embodiment, the paste printer 122 includes a paste dispenser 136 for dispensing an amount of solder paste on a top side 134 of the stencil 120 in relation to the second print pattern 126 and a print head including a set of squeegee blades 138 for spreading the dispensed solder paste across the second print pattern 126 of the stencil 120 to deposit the solder paste through the plurality of apertures 130 and onto corresponding solder pads of the second PCB 204. It should be appreciated that the set of squeegee blades 138 is arranged to move along the Y-axis (see FIG. 3) when spreading the solder paste across the second print pattern 126.

Figure 7:
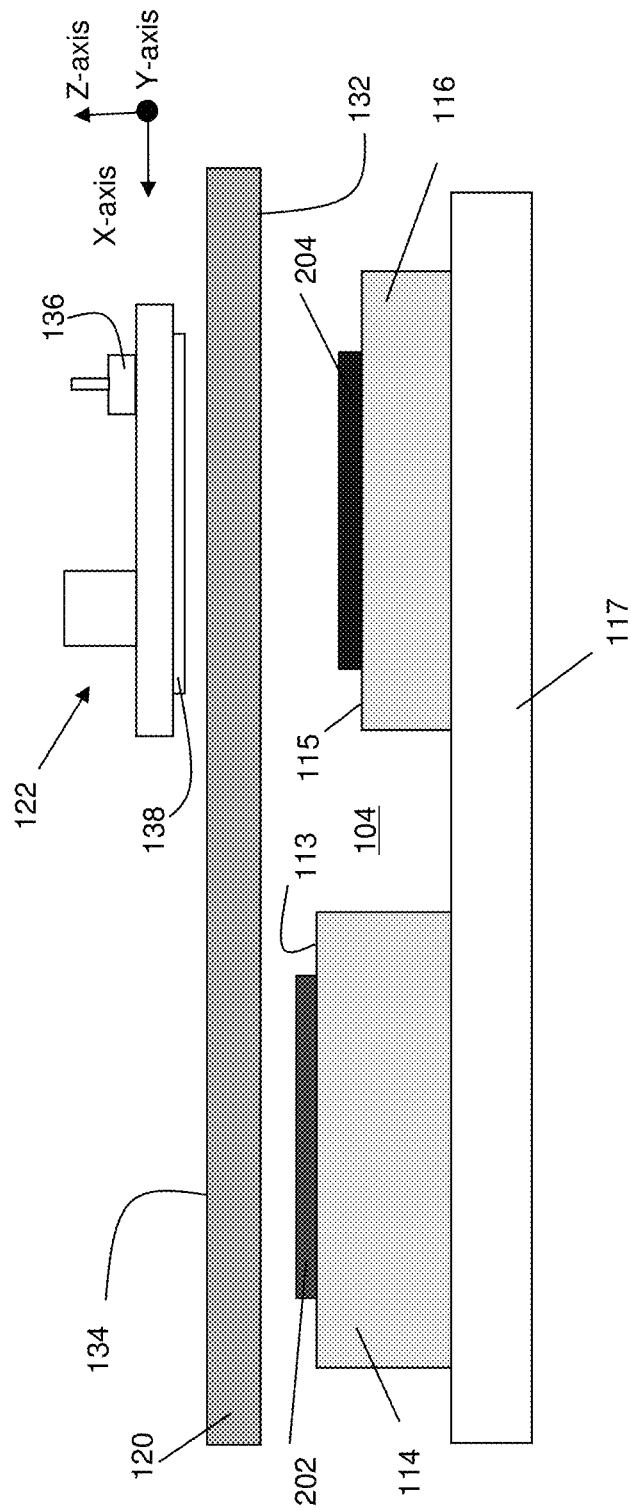

After printing of the second PCB 204, both PCBs 202, 204 are lowered by a few millimeters by lowering the lifting table 117. Further, the second PCB 204 is lowered even further along a micro Z axis in the vertical direction by lowering the second lifting block 116 by a corresponding amount, and the relative positions between the first PCB/first lifting block 202,114, second PCB/second lifting block 204,116 and the stencil 118 are shown in FIG. 7. It should be mentioned that each lifting block 114,116 includes an individually-controllable mechanism (for example, motors or hydraulics) for moving a substrate supporting surface 113,115 of each lifting block 114,116 independently and by a few millimeters (for example, between 3 and 5 mm) along the micro Z-axis. With both the PCBs 202, 204 lowered, the processor 110 realigns the stencil 120 based on the fiducial measurements explained earlier so that the first print pattern 124 is in registration with the corresponding pad layout of the first PCB 202.

Figure 8:
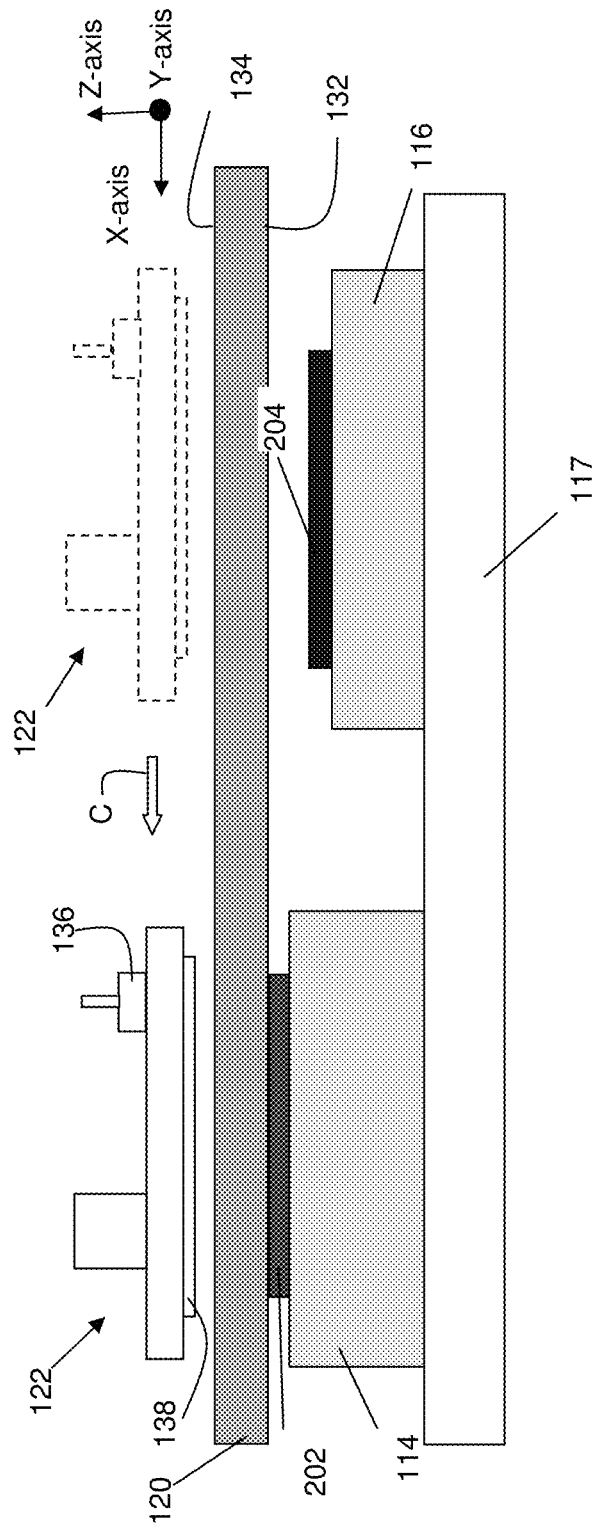

With the stencil 120 realigned, the processor 110 activates the lifting table 117 to lift both the first and second lifting blocks 114,116 and thus raises the first PCB 202 so that it engages the bottom side 132 of the stencil 120 while the second lifting block 116 in the lower position (as explained earlier). The second PCB 204 (which is already printed with solder paste) is thus spaced from the stencil 120. This arrangement is shown in FIG. 8. Next, the processor 110 activates the paste printer 122 to move from the position of the second print pattern 126 (the paste printer 122 is shown in broken lines in FIG. 8) linearly along the X-axis (arrow C) to a position of the first print pattern 124 (i.e. above the first PCB 202 as shown in FIG. 8).

The paste dispenser 136 next discharges a further predetermined amount of solder paste onto the top side 134 of the stencil 120 in relation to the first print pattern 124 and the set of squeegee blades 138 is next controlled to move in the Y-axis to spread the solder paste over the first print pattern 124 so that the solder paste is deposited on the first PCB 202 via the first print pattern 124.

Figure 9:
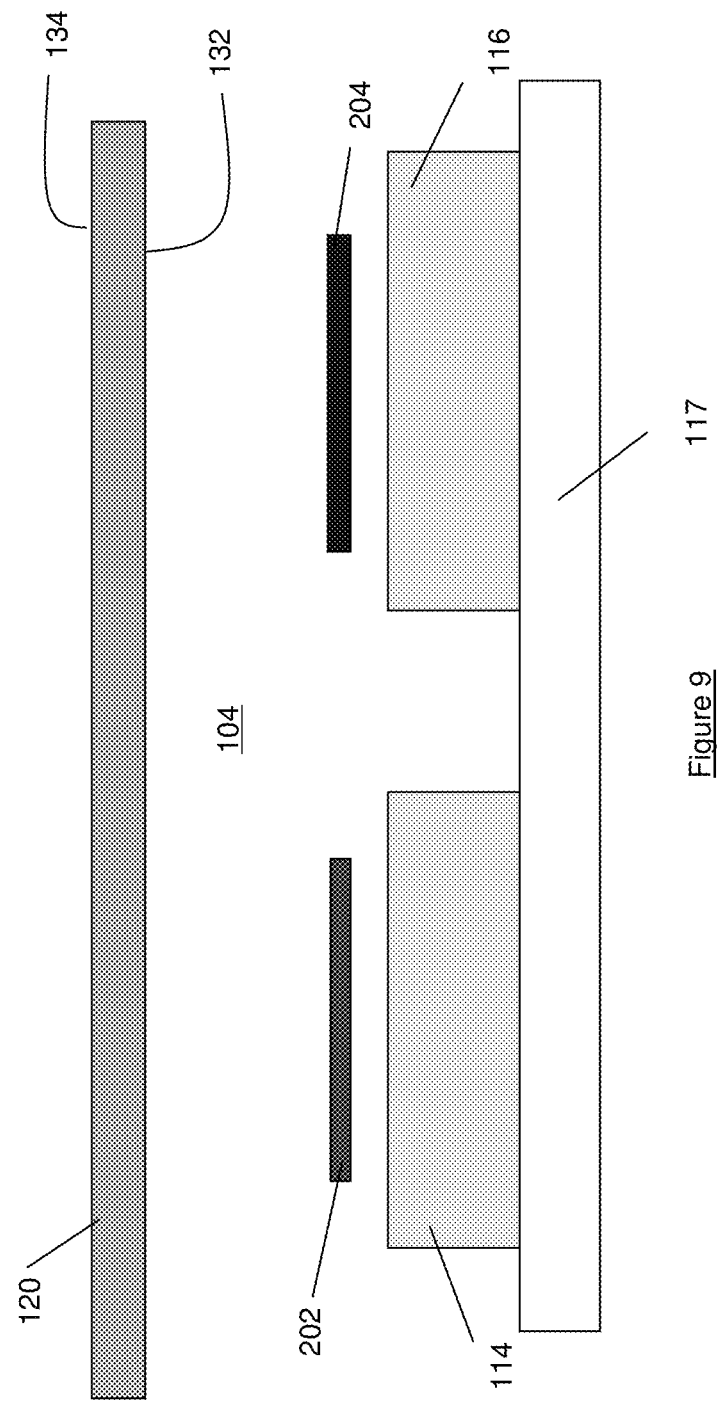
Figure 10:
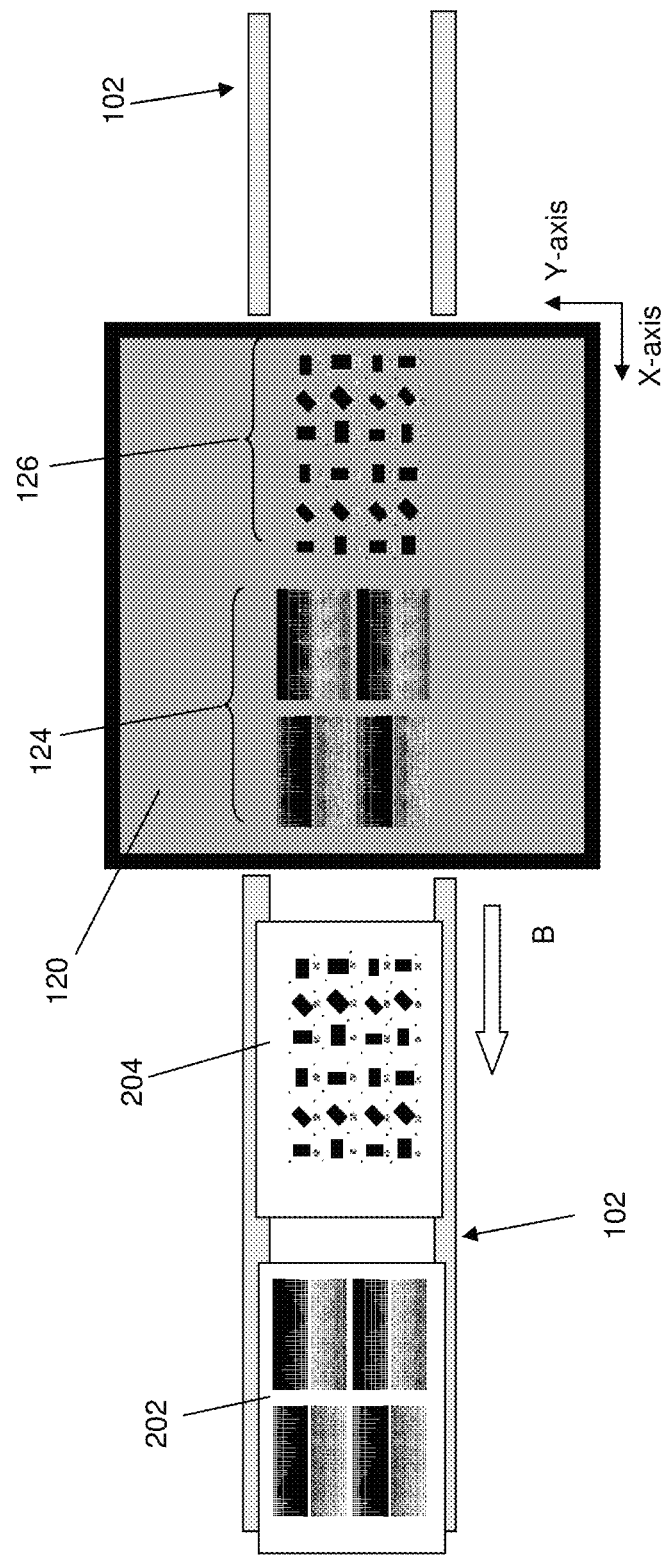
FIG. 10 is a top plan view of the first and second PCBs 202, 204 showing the PCBs after completing the paste printing of FIGS. 4 to 9.

After the first PCB 202 has also been printed, both PCBs 202, 204 are lowered to the transport level as shown in FIG. 9 by lowering the lifting table 117, wherein the conveyor system 102 transports the printed PCBs 202, 204 out of the printing chamber 104 and out of the printer 100. FIG. 10 is a top plan view of the stencil 120 and the two printed PCBs 202, 204 and it should be appreciated that the two PCBs 202, 204 have been printed with solder paste based on the print patterns 124, 126 of the stencil 120.

With such an arrangement, only one printer 100 (and thus only one stencil 120) is necessary to support high mixed manufacturing requirements with an option of having a single print head (in the form of the set of squeegee blades 138) for sequential paste printing of the two PCB's 202, 204. This sequence of operation enables individual PCB 202, 204 alignment to the stencil 120 without a need to develop an alignment algorithm and separate mechanical alignment mechanisms for aligning two print patterns simultaneously. With one printer being able to print different print patterns (or images), this obviates the need of having another printer, thus resulting in savings in costs and expenditure. The addition of the two lifting blocks 114,116 enables new functionality, and in particular when the two lifting blocks 114,116 are supported by the lifting table 117. As it can be appreciated from the described embodiment, the lifting table 117 serves to raise and lower the lifting blocks 114,116 to raise the PCBs 202, 204 on these lifting blocks between the transport level and the vision level. Also the lifting table moves the lifting blocks 114,116 and thus, the PCBs 202,204 between the vision level to and the printing level but in this case during this operation the addition of the lifting blocks 114,116 provide an additional Z axis movement which allows each lifting block to selectively present one or the other PCB 114,116 to the stencil 120 using the major Z movement from the lifting table plus or minus the "Micro Z" axis movement enabled by the lifting blocks 114,116.

Being able to perform the paste printing of two PCBs 202, 204 sequentially using one printer enables printing of different print patterns on different PCBs 202, 204, with appropriate changes to the print patterns 124, 126. It is also envisaged that the print patterns 124, 126 to be printed on the two consecutive PCBs 202, 204 may be identical which allows processing of two PCBs together within the printing chamber 104, rather than loading one after another into the printing chamber 104.

Another possibility is to use the proposed arrangement and method to print small features with a low level of paste say, for example 0.03 mm high. This may be done using a first print area of the stencil 120 and then in a second print area of the stencil 120, a thicker foil say 0.15 mm may be used to allow greater paste volumes to be printed using the second print area on the same PCB. In the second print area of the stencil 120, cavities may be provided on the underside of the stencil 120 so that the 0.03 mm paste deposits from the first print area are not touched when depositing the 0.15 mm paste deposits. In other words, by providing a stencil 120 having two print areas (or print patterns) with each having a different foil/stencil thickness, this allows such paste printing to be completed using one printer.

Indeed, the /screen printer 100 may be configured to process one PCB at a time by programming the processor 110 accordingly. In this way, the processor 110 may be arranged to select one or two (or more) of the lifting tables 114, 116 to be used. For example, if only one PCB is to be processed, then only one of the lifting tables 114, 116 is activated to individually support the PCB. This is particularly useful at line ramp-up or ramp-down when only one side of the PCB may be ready for processing. The paste printer may thus be configured by the processor to apply the paste material selectively to one or two substrates (or more) depending on the number of substrates to be processed in the printing chamber 104.

It is also possible that if one PCB 204 has been printed, and the other PCB 202 is being printed, the PCB 204 which has already been printed may be lowered to a transport level and conveyed to the next process station while a new PCB is being loaded into the printing chamber i.e. of the first print area.

The described embodiments should not be construed as limitative. For example, the described embodiment may be adapted for stencil printers, not just screen printers. Also, the printing may be performed on other types of substrates (such as a ceramic substrate) not just PCBs. Likewise, other types of paste material may be used, such as epoxy materials, not just solder paste. Further, the print pattern 124, 126 of the stencil 120 may be the same image or different images and likewise, the printer 100 may be configured to print different granularity of paste material on the same PCB.

In the described embodiment, the second print pattern 126 of the stencil 120 is first aligned/registered to the second PCB 204 for printing the second PCB 204 first but it should be apparent that the first PCB 202 may be registered to the first print pattern 124 of the stencil 120 first (and thus be printed first) followed by the second PCB 204.

There may not be only one print head/set of squeegee blades 138. Instead, more than one print head may be used. Similarly, the number of paste dispensers 136 may also be more than one. Instead of using lifting tables 114, 116, the support members may be in the form of a clamping mechanism for individually clamping and supporting the respective substrates in order to adjust the relative distances between the stencil 120 and the substrates 202, 204. Indeed, the relative distances between the stencil 120 and the PCBs 202, 204 may be adjusted by moving the stencil 120 (while maintaining the positions of the two PCBs 202, 204) and not necessarily by raising or lowering the PCBs 202, 204. Further, in the described embodiment, the lifting table 117 is used to collectively raise or lower the two lifting blocks 114,116 at certain steps but this may not be so since the two lifting blocks 114,116 may be moved independently and the movement synchronised.

Also, although the described embodiment describes using twin PCB stoppers, the number of stoppers may vary depending on application (and indeed, the number of support members such as lifting tables 114, 116 which are used may be more than two). Moreover, other ways of stopping the PCBs may be envisaged (for example, infrared light sensors).

Having now fully described the invention, it should be apparent to one of ordinary skill in the art that many modifications can be made hereto without departing from the scope of the invention as claimed.

The invention claimed is:

1. A screen printer comprising
   a printing chamber;
   a plurality of support members for supporting one or more substrates in the printing chamber, the plurality of support members being arranged adjacent to one another along a single conveying path for conveying the one or more substrates with each support member capable of individually supporting a respective substrate in a printing position;
   a stencil having a plurality of print patterns with each print pattern arranged adjacent to another print pattern to correspond to positions of the support members with each print pattern corresponding to a desired paste pattern to be printed on at least one substrate supported by one of the support members at the printing position; and
   a paste printer arranged to print paste material on the at least one substrate using at least one of the print patterns.

2. The screen printer according to claim 1, further comprising a processor configured to select one or more of the support members for supporting a respective substrate depending on the number of substrates to be received in the printing chamber at any one time.

3. The screen printer according to claim 2, wherein the paste printer is arranged to selectively apply the paste material to the one or more substrates using either one or more of the print patterns depending on the selection by the processor.

4. The screen printer according to claim 1, wherein the printing chamber is arranged to receive a first substrate and a second substrate, and the number of support members includes a first support member and a second support member arranged to support the first and second substrates respectively.

5. The screen printer according to claim 4, wherein the first support member and the stencil are moveable relative to each other to adjust their relative distance for moving the first substrate between a transport position through which the first substrate is transported into and out of the printing chamber, a vision position for fiducial recognition of the first substrate, and the printing position.

6. The screen printer according to claim 5, wherein the second support member and the stencil is moveable relative to each other to adjust their relative distance for moving the second substrate between the transport position through which the second substrate is transported into and out of the printing chamber, the vision position for fiducial recognition of the second substrate, and the printing position.

7. The screen printer according to claim 4, wherein the first and second support members are arranged to be separately alignable with the stencil for registering a first one and a second one of the print patterns sequentially with respective desired paste patterns of the first and second substrates; and wherein the paste printer is arranged to print paste material onto the substrates located on the first and second support members sequentially.

8. The screen printer according to claim 7, wherein the paste printer includes a single print head arranged to move linearly along a first axis relative to the stencil between a first position for printing the paste material onto the first substrate and a second position for printing the paste material onto the second substrate.

9. The screen printer according to claim 7, wherein the paste printer includes two print heads arranged to print the paste material onto the first and second substrates respectively.

10. The screen printer according to claim 1, comprising a plurality of substrate stoppers with each substrate stopper being arranged to stop each respective substrate at a predetermined position when two or more substrates are conveyed into the printing chamber.

11. The screen printer according to claim 1, wherein the plurality of print patterns includes two print patterns and the plurality of support members include two support members.

12. The screen printer according to claim 11, wherein one print pattern is different from the other print pattern.

13. The screen printer according to claim 11, wherein the two print patterns are the same.

14. The screen printer according to claim 13, wherein the stencil has a variable thickness.

15. A screen printing method comprising the steps of
providing a printing chamber;
arranging a plurality of support members for supporting one or more substrates in the printing chamber, the plurality of support members being arranged adjacent to one another along a single conveying path for conveying the one or more substrates with each support member capable of individually supporting a substrate at a printing position;
providing a stencil having a plurality of print patterns with each print pattern arranged adjacent to another print pattern to correspond to the adjacent arrangement of the support members;
supporting at least one substrate with one of the support members at the printing position, the at least one substrate including a desired paste pattern; and
printing paste material on the at least one substrate using at least one of the print patterns which corresponds to the desired paste pattern.

16. The screen printing method according to claim 15, further comprising the steps of selecting one or more of the support members for supporting a respective substrate depending on the number of substrates to be received in the printing chamber at any one time.

17. The screen printing method according to claim 16, further comprising the step of applying the paste material selectively to the one or more substrates using at least one of the print patterns depending on the selection.

18. The screen printing method according to claim 15, further comprising the steps of receiving a first substrate and a second substrate in the printing chamber, and supporting the first and second substrates using a first support member and a second support member respectively.

19. The screen printing method according to claim 18, further comprising the step of moving the first support member, the second support member and the stencil relative to each other to adjust their relative distances to move the first and second substrates from a transport position through which the first and second substrates are transported into and out of the printing chamber; to a vision recognition position for fiducial recognition of the first and second substrates and then to the printing position.

20. The screen printing method according to claim 19, further comprising, at the vision recognition position, the step of aligning the stencil with the second support member to register a second print pattern with the second substrate; and in the printing position, the step of printing the paste material onto the second substrate using the second print pattern.

21. The screen printing method according to claim 20, further comprising the steps of
adjusting relative distances between the first and second support members and the stencil away from each other to space the first substrate and the printed second substrate from the support member;
aligning the stencil with the first support member to register a first one of the print pattern with the first substrate;
moving the first support member to the printing position; and
printing the paste material on the first substrate using the first print pattern.

22. The screen printing method according to claim 21, further comprising the steps of changing the relative positions between the first and second support members and the stencil to move the first and second substrates to the transport position; and transporting the first and second substrates out of the printing chamber.

23. The screen printing method according to claim 18, further comprising the step of providing a single print head for printing the paste material, and the method includes the step of moving the single print head linearly along a first axis relative to the stencil between a first position for printing the paste material on the first substrate and a second position for printing the paste material on the second substrate.

24. The screen printing method according to claim 18, further comprising the step of providing two print heads for printing the paste material, and the method includes the step of printing the paste material on the first and second substrates using the respective print heads.

25. The screen printing method according to claim 18, further comprising the step of conveying two or more substrates into the printing chamber, and stopping each substrate at a predetermined position using a respective substrate stopper.

* * * * *